US010756097B2

(12) United States Patent
Reznicek et al.

(10) Patent No.: US 10,756,097 B2
(45) Date of Patent: Aug. 25, 2020

(54) STACKED VERTICAL TRANSISTOR-BASED MASK-PROGRAMMABLE ROM

(71) Applicant: International Business Machines Corporation, Armonk, NY (US)

(72) Inventors: Alexander Reznicek, Troy, NY (US); Karthik Balakrishnan, Scarsdale, NY (US); Tak Ning, Yorktown Heights, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/590,199

(22) Filed: Oct. 1, 2019

(65) Prior Publication Data
US 2020/0035691 A1  Jan. 30, 2020

Related U.S. Application Data

(62) Division of application No. 16/024,229, filed on Jun. 29, 2018, now abandoned.

(51) Int. Cl.
*H01L 29/78* (2006.01)
*H01L 27/112* (2006.01)
(Continued)

(52) U.S. Cl.
CPC .... *H01L 27/1128* (2013.01); *H01L 21/26513* (2013.01); *H01L 27/11273* (2013.01);
(Continued)

(58) Field of Classification Search
CPC ......... H01L 29/06; H01L 29/08; H01L 29/10; H01L 29/20; H01L 29/78; H01L 29/66;
(Continued)

(56) References Cited

U.S. PATENT DOCUMENTS 4,272,880 A   6/1981 Pashley
4,493,057 A   1/1985 McElroy
(Continued)

FOREIGN PATENT DOCUMENTS

WO   WO2016057973 A1   4/2016

OTHER PUBLICATIONS

List of IBM Patents or Applications Treated as Related (2 pages).

*Primary Examiner* — Chuong A Luu
(74) *Attorney, Agent, or Firm* — Vazken Alexanian; Michael J. Chang, LLC

(57) ABSTRACT

VFET-based mask-programmable ROM are provided. In one aspect, a method of forming a ROM device includes: forming a bottom drain on a wafer; forming fins on the bottom drain with a top portion having a channel dopant at a different concentration than a bottom portion of the fins; forming bottom/top dummy gates alongside the bottom/top portions of the fins; forming a source in between the bottom/top dummy gates; forming a top drain above the top dummy gates; removing the bottom/top dummy gates; and replacing the bottom/top dummy gates with bottom/top replacement gates, wherein the bottom drain, the bottom replacement gates, the bottom portion of the fins, and the source form bottom VFETs of the ROM device, and wherein the source, the top replacement gates, the top portion of the fins, and the top drain form top VFETs stacked on the bottom VFETs. A ROM device is also provided.

20 Claims, 9 Drawing Sheets

(51) Int. Cl.
*H01L 29/10* (2006.01)
*H01L 29/66* (2006.01)
*H01L 21/265* (2006.01)

(52) U.S. Cl.
CPC ........ *H01L 29/105* (2013.01); *H01L 29/1037* (2013.01); *H01L 29/6656* (2013.01); *H01L 29/66545* (2013.01); *H01L 29/66666* (2013.01); *H01L 29/7827* (2013.01)

(58) Field of Classification Search
CPC ........... H01L 29/6656; H01L 29/66666; H01L 29/66545; H01L 29/7827; H01L 29/105; H01L 29/1037; H01L 29/739; H01L 29/66522; H01L 29/0847; H01L 29/66356; H01L 29/7391; H01L 29/092; H01L 29/0649; H01L 29/417; H01L 29/41791; H01L 29/7853; H01L 29/167; H01L 29/16; H01L 29/161; H01L 29/1608; H01L 29/0676; H01L 29/7817; H01L 29/7833; H01L 29/7835; H01L 29/78642; H01L 29/786; H01L 29/66659; H01L 29/66681; H01L 27/088; H01L 27/0873; H01L 27/0924; H01L 27/082; H01L 27/092; H01L 27/1128; H01L 27/11273; H01L 27/112
USPC ........................................................ 257/329
See application file for complete search history.

(56) References Cited

U.S. PATENT DOCUMENTS

| | | |
|---|---|---|
| 5,308,782 A | 5/1994 | Mazure et al. |
| 6,020,250 A | 2/2000 | Kenney |
| 6,969,642 B2 | 11/2005 | Yang et al. |
| 9,559,110 B2 | 1/2017 | Lee |
| 10,615,159 B2* | 4/2020 | Cheng ............... H01L 29/66681 |
| 2003/0002321 A1 | 1/2003 | Chang |
| 2004/0159910 A1 | 8/2004 | Fried et al. |
| 2006/0091455 A1 | 5/2006 | Adan |
| 2013/0313564 A1 | 11/2013 | Okada et al. |
| 2014/0152343 A1 | 6/2014 | Chang |
| 2018/0226494 A1* | 8/2018 | Anderson ............ H01L 29/161 |

* cited by examiner

STACKED VERTICAL TRANSISTOR-BASED MASK-PROGRAMMABLE ROM

CROSS-REFERENCE TO RELATED APPLICATIONS

This application is a divisional of U.S. application Ser. No. 16/024,229 filed on Jun. 29, 2018, the contents of which are incorporated by reference herein.

FIELD OF THE INVENTION

The present invention relates to vertical field effect transistor (VFET) devices, and more particularly, to VFET-based mask-programmable read-only memory (ROM).

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. Thus, VFETs are an attractive option for technology scaling for 5 nanometer (nm) and beyond.

Floating gate memory cells, which form the basis of flash memory, programmable read-only memory (PROM), erasable programmable read-only memory (EPROM) and electrically-erasable programmable read-only memory (EEPROM). Floating gate memory cells are important to the implementation of any technology.

Therefore, techniques for co-integration of non-volatile memories in a vertical FET technology would be desirable.

SUMMARY OF THE INVENTION

The present invention provides vertical field effect transistor (VFET)-based mask-programmable read-only memory (ROM) and techniques for fabrication thereof. In one aspect of the invention, a method of forming a ROM device is provided. The method includes: forming a bottom drain on a wafer; forming fins on the bottom drain, wherein the fins include a top portion having a channel dopant at a different concentration than a bottom portion of the fins; forming bottom dummy gates alongside the bottom portion of the fins and top dummy gates alongside the top portion of the fins; forming a source in between the bottom dummy gates and the top dummy gates; forming a top drain above the top dummy gates; removing the bottom dummy gates and the top dummy gates after the source and the top drain have been formed; and replacing the bottom dummy gates with bottom replacement gates and the top dummy gates with top replacement gates, wherein the bottom drain, the bottom replacement gates, the bottom portion of the fins, and the source form bottom VFETs of the ROM device, and wherein the source, the top replacement gates, the top portion of the fins, and the top drain form top VFETs of the ROM device stacked on the bottom VFETs.

In another aspect of the invention, a ROM device is provided. The ROM device includes: a wafer; a bottom drain disposed on the wafer; fins disposed on the bottom drain, wherein the fins include a top portion having a channel dopant at a different concentration than a bottom portion of the fins; bottom gates disposed alongside the bottom portion of the fins and top gates disposed alongside the top portion of the fins; a source in between the bottom gates and the top gates; and a top drain disposed above the top gates, wherein the bottom drain, the bottom gates, the bottom portion of the fins, and the source form bottom VFETs of the ROM device, and wherein the source, the top gates, the top portion of the fins, and the top drain form top VFETs of the ROM device stacked on the bottom VFETs.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming stacked vertical field effect transistor (VFET)-based mask-programmable read-only memory (ROM). Advantageously, with a VFET-based architecture, for a given chip area the density will be doubled for a two-stack ROM. Further, using standard bit-line/word-line wiring, additional area can be saved by connecting the word lines of the stacked VFETs together internally. As will be described in detail below, the stacked VFET structure is leveraged simply by implanting "0" or "1" regions as needed for ROM.

Figure 1:
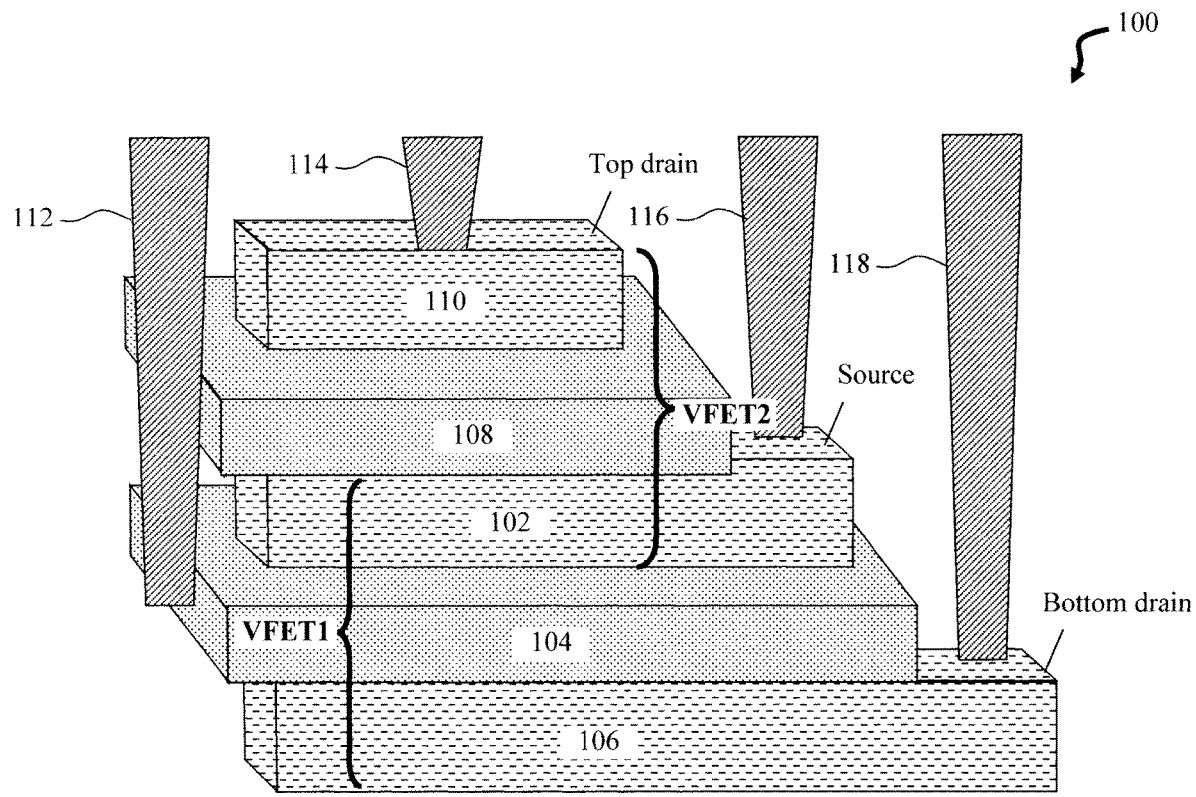
FIG. 1 is a schematic diagram illustrating the present VFET-based mask-programmable ROM according to an embodiment of the present invention.

FIG. 1 is a schematic diagram which provides an overview of the layout of the present VFET-based mask-programmable ROM 100. As shown in FIG. 1, ROM 100 includes two stacked VFETs connected in parallel with a common source. Namely, each VFET includes a (vertically-stacked) source and a drain, and a gate surrounding a channel (see FIG. 2) in between the source and drain. Thus, for instance, the bottom VFET (VFET 1) includes a source 102 and a drain 106, and a gate 104 surrounding a channel 202 (see FIG. 2, below). The top VFET (VFET 2) shares source 102 in common with VFET 1. For instance, VFET2 includes source 102 and a drain 110, and a gate 108 surrounding a channel 204 (see FIG. 2, below). Drains 106 and 110 form the "Bottom drain" and "Top drain," respectively, of VFET-based ROM 100, and source 102 forms the common "Source" of VFET-based ROM 100.

A contact 112 connects the gate 104 and the gate 108. Contacts 114, 116 and 118 are present to the Top drain, common Source, and Bottom drain, respectively.

Figure 2:
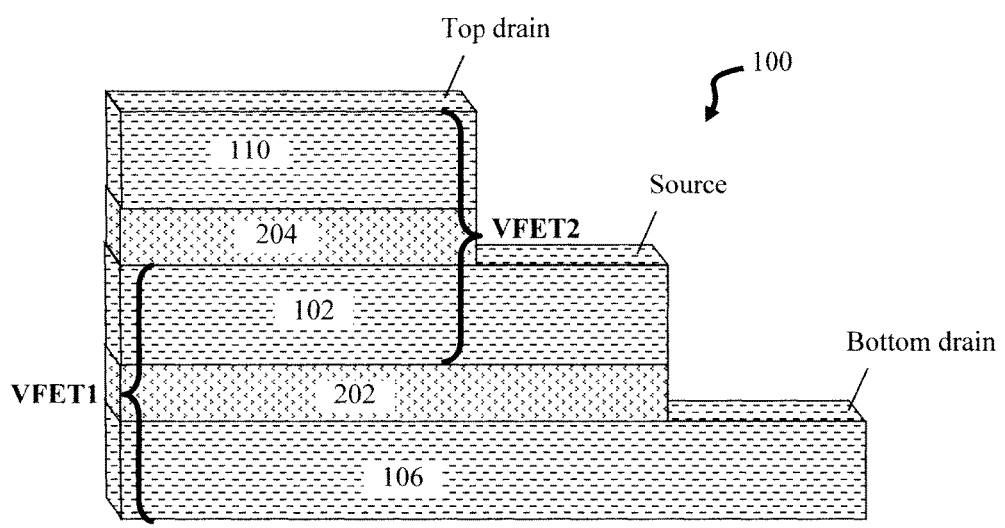
FIG. 2 is a schematic diagram illustrating the VFET-based mask-programmable ROM of FIG. 1 showing the channels according to an embodiment of the present invention.

FIG. 2 is a schematic diagram of the present VFET-based mask-programmable ROM 100 which shows the channel 202 and channel 204 for clarity. As provided above, the channels 202 and 204 are wrapped around by the gates 104 and 108 which are not shown in FIG. 2. As shown in FIG. 2, the bottom VFET (VFET 1) includes channel 202 interconnecting source 102 and drain 106, and the top VFET (VFET 2) includes channel 204 interconnecting (common) source 102 and a drain 110.

Figure 3:
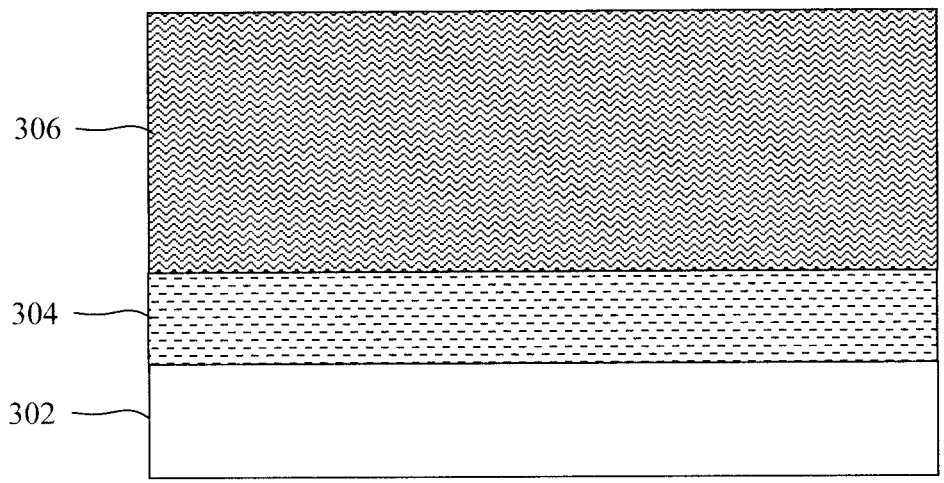
FIG. 3 is a cross-sectional diagram illustrating a bottom fin and a bottom drain having been formed on a wafer according to an embodiment of the present invention.

An exemplary methodology for forming the present VFET-based mask-programmable ROM 100 is now described by way of reference to FIGS. 3-15. As shown in FIG. 3, the process begins by forming a bottom fin 306 and a bottom drain 304 on a substrate wafer 302.

According to an exemplary embodiment, wafer 302 is a bulk semiconductor wafer, such as a bulk silicon (Si), bulk germanium (Ge), a silicon germanium (SiGe) substrate and/or bulk III-V semiconductor wafer. Alternatively, wafer 302 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

According to an exemplary embodiment, an epitaxial process is used to grow the bottom drain 304 and bottom fin 306 on the wafer 302. For instance, the bottom drain 304 is formed from a doped epitaxial material. Suitable n-type dopants include, but are not limited to, phosphorous (P) and/or arsenic (As), and suitable p-type dopants include, but are not limited to, boron (B). By way of example only, the bottom drain 304 can be formed from epitaxial phosphorous-doped Si (Si:P) or boron-doped SiGe (SiGe:B). By contrast, the bottom fin 306 is formed from an undoped epitaxial material, such as Si, Ge, SiGe, and/or a III-V semiconductor. By way of example only, the bottom drain 304 and bottom fin 306 can be grown in-situ on the wafer 302 by simply turning off the dopant source after the bottom drain 304 has been formed, with the balance of the growth being used to form the undoped bottom fin 306. For instance, using Si as an example, epitaxial Si:P can be grown on the wafer 302 until the bottom drain 304 is formed to a desired thickness, after which the dopant source can be turned off and undoped Si is deposited until the bottom fin 306 is formed to a desired thickness on the bottom drain 304.

According to an exemplary embodiment, the bottom drain has a thickness of from about 20 nanometers (nm) to about 150 nm and ranges therebetween. According to an exemplary embodiment, the bottom fin 306 has a thickness of from about 30 nm to about 80 nm and ranges therebetween.

The next task is to selectively dope a (first) portion I of the bottom fin 306 to create "0" transistors for the bottom region of the ROM 100. The notion here is that channel doping concentration will be used to determine whether the threshold voltage (Vt) of the corresponding VFET is positive or negative, i.e., Vt<0 or Vt>0, and therefore whether the programmed value is "0" or "1," respectively. The term "programmed" refers to the "mask programmable" aspect of the present ROM. Namely, the threshold voltage is programmed in the ROM during manufacture, i.e., using selective masking steps (see below).

Figure 4:
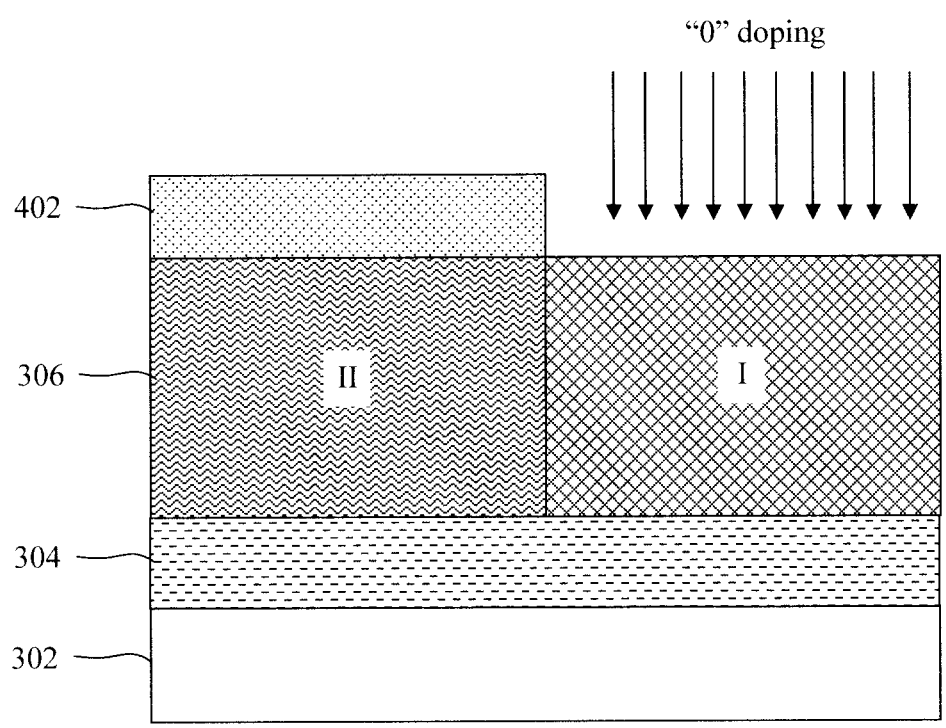
FIG. 4 is a cross-sectional diagram illustrating a lithographic mask having been formed over/masking a second region II of the bottom fin, and an implant of "0" doping being performed into a first region I of the bottom fin according to an embodiment of the present invention.

The first portion I of the bottom fin 306 will be doped to form "0" transistors, while a second portion II of the bottom fins 306 will be doped to form "1" transistors. Namely, as shown in FIG. 4, a lithographic mask 402 is formed over/masking the second region II of bottom fin 306, and an implant of "0" doping is performed into the first region I of the bottom fin 306. According to an exemplary embodiment, the terms "0" doping and "1" doping as used herein refer to dopants of the same polarity (i.e., either n-type or p-type dopants—see above) being employed at different concentrations. For instance, either an n-type (e.g., P and/or As) or p-type (B) dopant at a low concentration can be used for "1" doping, while that same dopant(s) at a high concentration can be used for "0" doping. By way of example only, a low concentration of dopant is from about $1 \times 10^{15}$ cm$^{-3}$ (undoped) to about $1 \times 10^{16}$ cm$^{-3}$ and ranges therebetween, and a high dopant concentration is from about $1 \times 10^{18}$ cm$^{-3}$ to about $1 \times 10^{19}$ cm$^{-3}$ and ranges therebetween.

The lithographic mask 402 can be formed by depositing a suitable mask material onto the bottom fin 306 and then using standard lithography and etching techniques to pattern the mask material into the lithographic mask 402. Suitable mask materials include, but are not limited to, nitride hardmask materials such as silicon nitride (SiN). Following implant of the "0" doping into the first region I of bottom fin 306 the lithographic mask 402 is removed.

Figure 5:
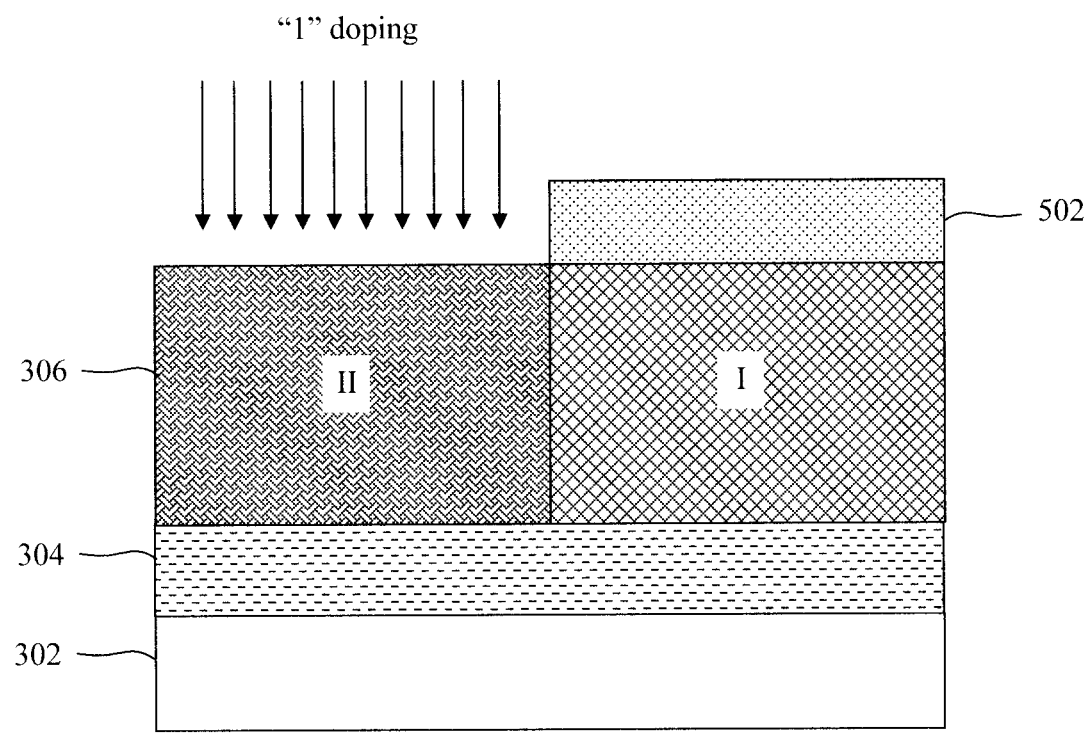
FIG. 5 is a cross-sectional diagram illustrating another lithographic mask having been formed over/masking the first region I of bottom fin, and an implant of "1" doping being performed into the second region II of the bottom fin according to an embodiment of the present invention.
Figure 6:
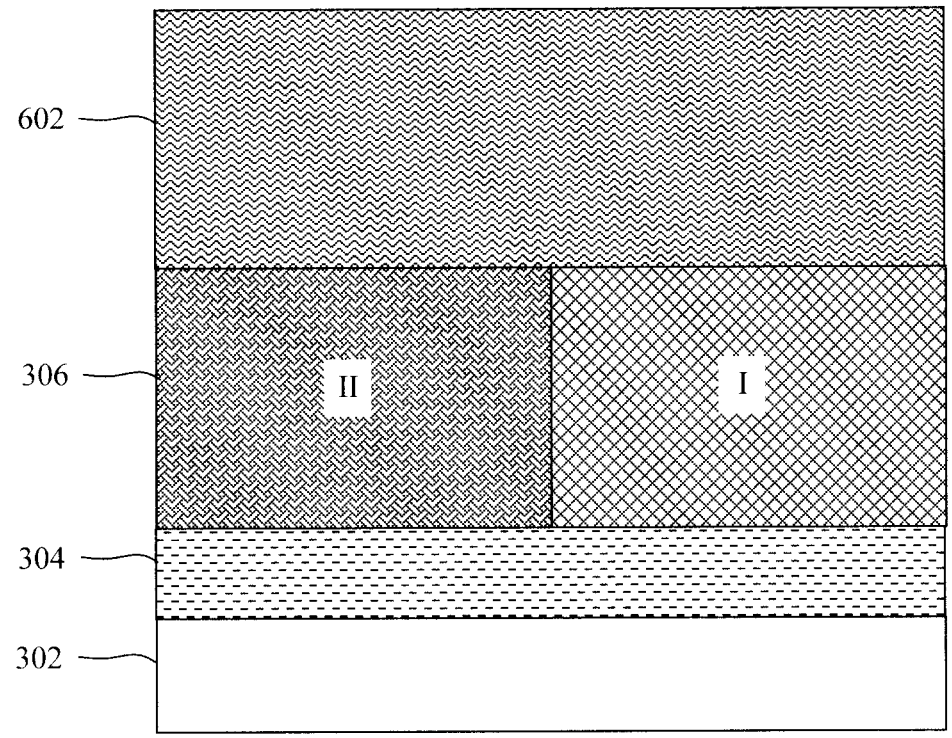
FIG. 6 is a cross-sectional diagram illustrating a top fin having been formed on the bottom fin according to an embodiment of the present invention.
Figure 7:
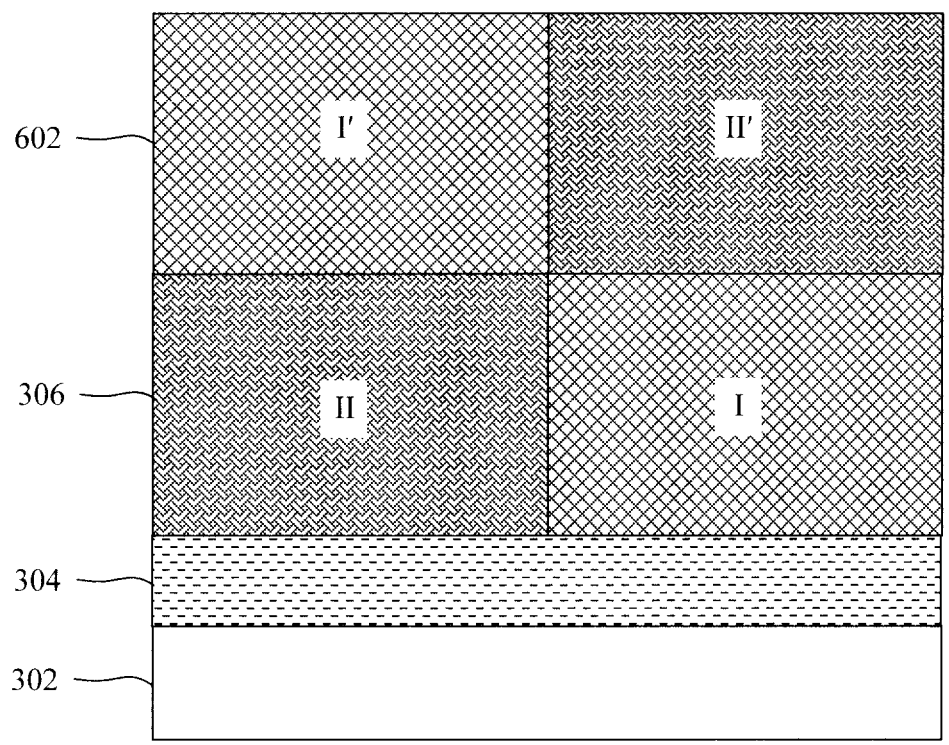
FIG. 7 is a cross-sectional diagram illustrating the same masking/implantation process having been used to selectively dope a first portion I' of the top fin to create "0" transistors and a second portion II' of the top fin to create "1" transistors according to an embodiment of the present invention.

The process is then repeated to implant "1" doping in the second region II of the bottom fin 306. For instance, as shown in FIG. 5 a lithographic mask 502 (e.g., a nitride hardmask) is formed over/masking the first region I of bottom fin 306, and an implant of "1" doping is performed into the second region II of the bottom fin 306. As provided above, either an n-type (e.g., P and/or As) or p-type (B) dopant at a low concentration can be used for "1" doping, while that same dopant(s) at a high concentration can be used for "0" doping. Following implant of the "1" doping into the first region I of bottom fin 306 the lithographic mask 502 is removed.

A top fin 602 is then formed on the bottom fin 306. See FIG. 6. According to an exemplary embodiment, an epitaxial process is used to grow the top fin 602 on the bottom fin 306. In that case, the top fin 602 is formed from an undoped epitaxial material, such as Si, Ge, SiGe, and/or a III-V semiconductor. According to an exemplary embodiment, the top fin 602 has a thickness of from about 30 nm to about 80 nm and ranges therebetween.

In the same manner as above, the next task is to selectively dope a (first) portion I' of the top fin 602 to create "0" transistors and a (second) portion II' of the top fin 602 to create "1" transistors for the top region of the ROM 100. See FIG. 7. As described above, channel doping concentration will be used to determine whether the Vt of the corresponding VFET is positive or negative, i.e., Vt<0 or Vt>0, and therefore whether the programmed value is "0" or "1," respectively. Notably, the (first) portion I' of the top fin 602 receiving the "0" doping is above the (second) portion II of the bottom fin 306 that received the "1" doping, and the (second) portion II' of the top fin 602 receiving the "1" doping is above the (first) portion I of the bottom fin 306 that received the "0" doping. Selectively doping the (first) portion I' and the (second) portion II' of the top fin 602 proceeds in the same manner as described above whereby lithographic masks are used to selectively cover one portion of the top fin 602 while the other receives the dopant implant, and vice versa. Thus, for brevity, the individual masking steps are not shown for the top fin 602 as they are the same as provided above.

Figure 8:
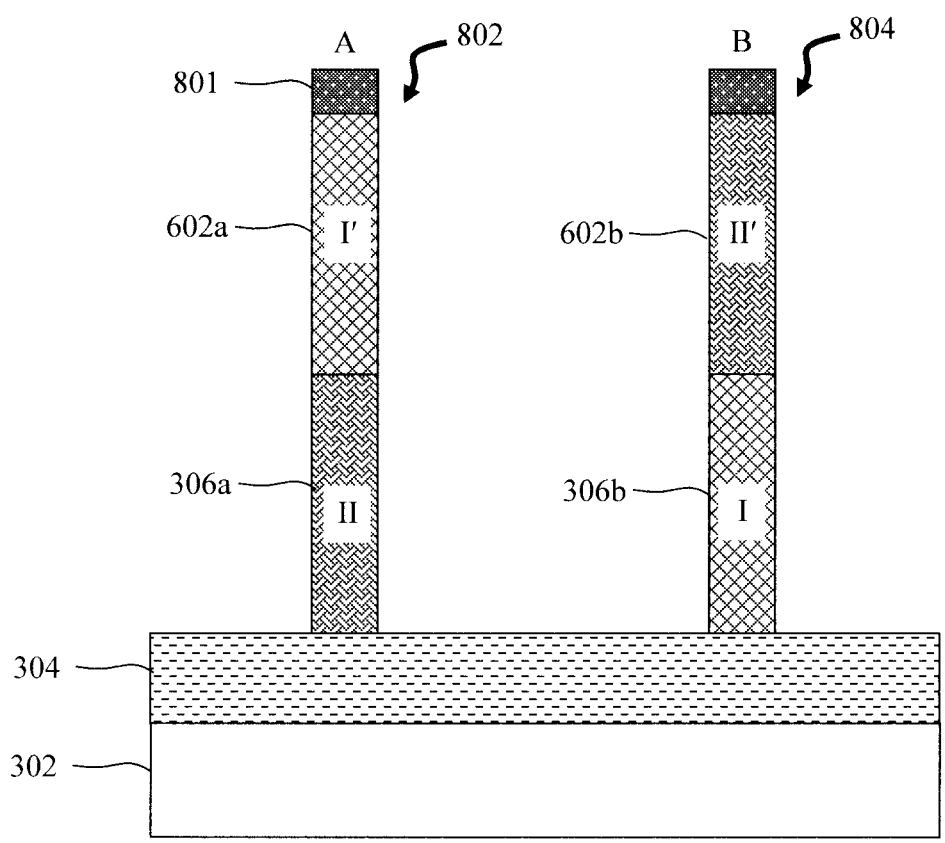
FIG. 8 is a cross-sectional diagram illustrating fins having been patterned in the bottom and top fin according to an embodiment of the present invention.

Next, fins are patterned in the bottom and top fin 306/602. See FIG. 8. For clarity, reference will be made to a first region A of the device including the (first) portion I' of top fin 602/(second) portion II of bottom fin 306, and a second region B of the device including the (second) portion II' of top fin 602/(first) portion I of bottom fin 306. Namely, as shown in FIG. 8, the fins include at least one (first) fin 802 patterned in the (first) portion I' of top fin 602/(second) portion II of bottom fin 306 and at least one (second) fin 804 patterned in the (second) portion II' of top fin 602/(first) portion I of bottom fin 306. To do so, fin hardmasks 801 are first formed on the top fin 602 marking the footprint and location of the fins 802 and 804. As shown in FIG. 8, at least one fin hardmask 801 is formed on the portion I' of the top fin and at least one fin hardmask 801 is formed on the portion II' of the top fin. Fin hardmasks 801 can be formed by depositing a suitable hardmask material onto the top fin 602 and then using standard lithography and etching techniques to pattern the hardmask material into fin hardmasks 801. Suitable hardmask materials include, but are not limited to, nitride hardmask materials such as SiN. The patterned portions of the bottom fin 306 and the top fin 602 in the fins 802 and 804 are now given reference numerals 306$a,b$ and 602$a,b$, respectively. A directional (anisotropic) etching process such as reactive ion etching (RIE) can be employed for the fin etch.

Figure 9:
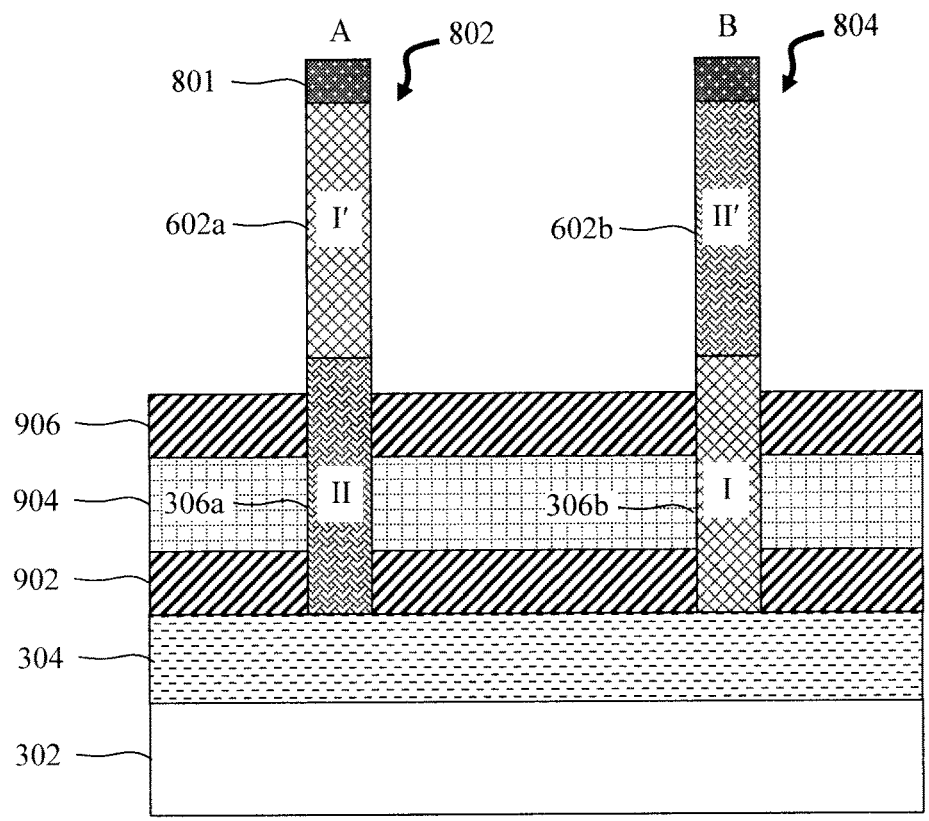
FIG. 9 is a cross-sectional diagram illustrating bottom spacers having been formed on the bottom drain, dummy gates having been formed on the bottom spacers alongside the fins, and first middle spacers having been formed on the bottom dummy gates according to an embodiment of the present invention.

In each VFET, bottom and top spacers will be used to offset the gate from the respective source and drains. Thus, as shown in FIG. 9, bottom spacers 902 are next formed on the bottom drain 304. Suitable materials for the bottom spacers 902 include, but are not limited to, oxide spacer materials such as silicon dioxide ($SiO_2$) and/or silicon oxycarbide (SiOC) and/or nitride spacer materials such as SiN, silicon-boron-nitride (SiBN) and/or silicon borocarbonitride (SiBCN).

According to an exemplary embodiment, the bottom spacers 902 are formed using a directional deposition process whereby the spacer material is deposited onto the bottom drain 304 and fins 802/804 with a greater amount of the material being deposited on horizontal surfaces (including on top of the bottom drain 304 in between the fins 802/804), as compared to vertical surfaces (such as along sidewalls of the fins 802/804). Thus, when an etch is used on the spacer material, the timing of the etch needed to remove the spacer material from the vertical surfaces will leave the bottom spacers 902 shown in FIG. 9 on bottom drain 304 since a greater amount of the spacer material was deposited on the bottom drain 304. By way of example only, a high-density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Dummy gates 904 are then formed on the bottom spacers 902 alongside the fins 802/804. Suitable dummy gate materials include, but are not limited to, poly-silicon (poly-Si) and amorphous silicon (a-Si). The term "dummy gate" refers to the sacrificial nature of this gate structure. Namely, dummy gates are typically used in what is referred to as a gate last process. In a gate last process, a sacrificial dummy gate is placed over the FET channel and acts as a placeholder for the final device gate, oftentimes a metal gate. Metal gates employ high-κ gate dielectrics that are particularly sensitive to the conditions (such as elevated temperatures) employed during formation of device structures such as the source and drain. Thus, placing a dummy gate enables the source and drain to be formed without consequence to the final gate structure. Afterwards, near the end of the process, the dummy gate is removed and replaced with a 'replacement' final gate.

Bottom dummy gates 904 can be formed by first blanket depositing a suitable dummy gate material (e.g., poly-Si, a-Si, etc.) and then using standard lithography and etching techniques to pattern the dummy gate material into the individual dummy gates 904 shown in FIG. 9. A recess of the dummy gates may be performed to, in this case, place the dummy gates 902 alongside only the bottom fin 306$a$/306$b$.

First middle spacers 906 are then formed on the bottom dummy gates 904. Suitable materials for the middle spacers 906 include, but are not limited to, oxide spacer materials such as $SiO_2$ and/or SiOC and/or nitride spacer materials such as SiN, SiBN and/or SiBCN. Again, a directional deposition process may be used to form the first middle spacers 906.

A sacrificial oxide layer 1002 is next formed on the first middle spacers 906. See FIG. 10. The sacrificial oxide layer 1002 separates the bottom from the top VFETs and will be removed later in the process to form the (common) source. Suitable materials for the sacrificial oxide layer 1002 include, but are not limited to, silicon oxide.

Figure 10:
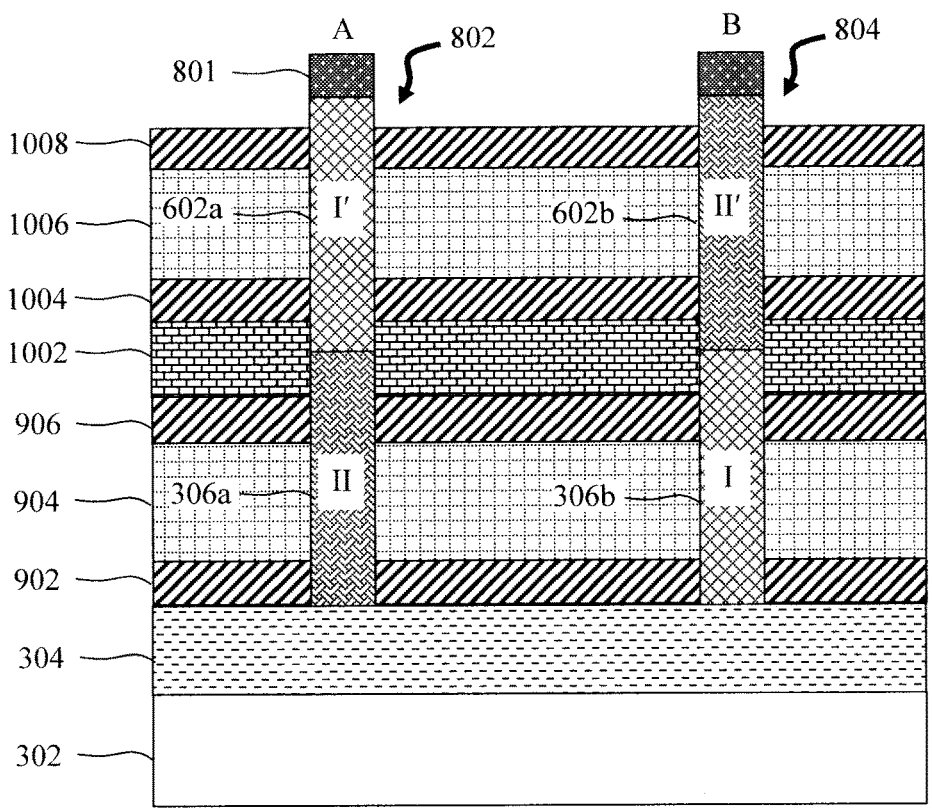
FIG. 10 is a cross-sectional diagram illustrating a sacrificial oxide layer having been formed on the first middle spacers, second middle spacers having been formed on the sacrificial oxide layer, and top spacers having been formed on the top dummy gates according to an embodiment of the present invention.

As shown in FIG. 10, second middle spacers 1004 are then formed on the sacrificial oxide layer 1002. Suitable materials for the middle spacers 906 include, but are not limited to, oxide spacer materials such as $SiO_2$ and/or SiOC and/or nitride spacer materials such as SiN, SiBN and/or SiBCN. Again, a directional deposition process may be used to form the second middle spacers 1004. Top dummy gates 1006 are then formed on the second middle spacers 1004 alongside the fins 802/804. As provided above, suitable dummy gate materials include, but are not limited to, poly-Si and a-Si.

Top spacers 1008 are formed on the top dummy gates 1006. Suitable materials for the top spacers 1008 include, but are not limited to, oxide spacer materials such as $SiO_2$ and/or SiOC and/or nitride spacer materials such as SiN, SiBN and/or SiBCN. Again, a directional deposition process may be used to form the top spacers 1008.

Figure 11:
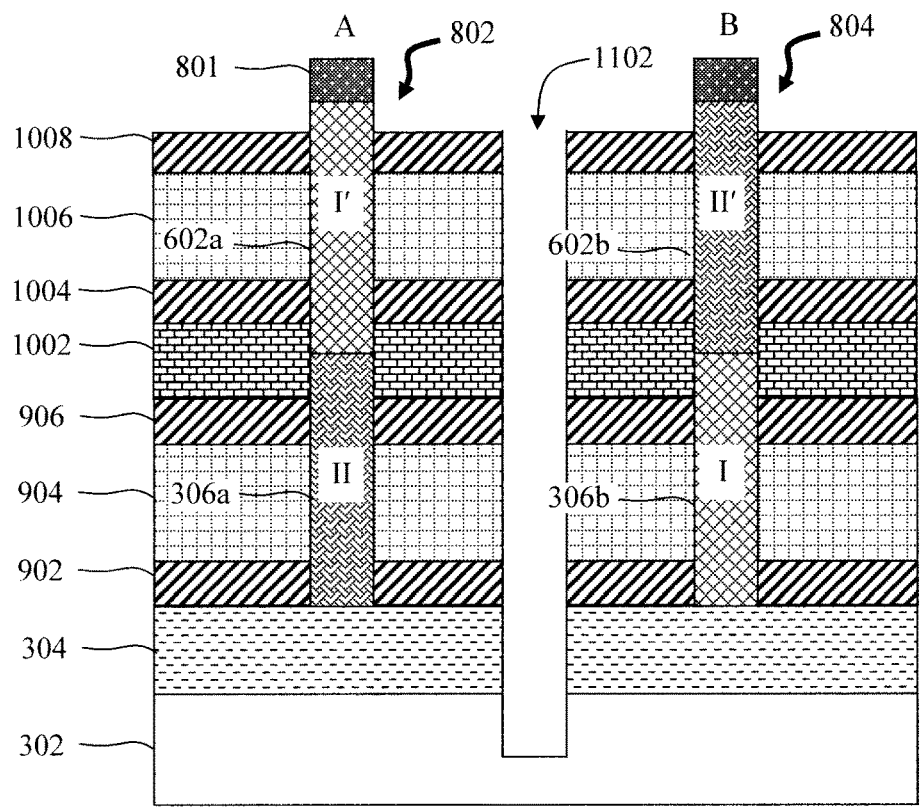
FIG. 11 is a cross-sectional diagram illustrating an STI trench having been formed in between the fins according to an embodiment of the present invention.

A shallow trench isolation (STI) trench 1102 is then formed in between and isolating/separating the fins 802 and 804. As shown in FIG. 11, the STI trench 1102 extends through the top spacers 1008, top dummy gates 1006, second middle spacers 1004, sacrificial oxide layer 1002, first middle spacer 906, bottom dummy gates 904, bottom spacers 902, bottom drain 304, and partway into the wafer 302. Standard lithography and etching techniques can be employed to pattern the STI trench 1102. A directional (anisotropic) etching process such as RIE can be employed for the trench etch.

Figure 12:
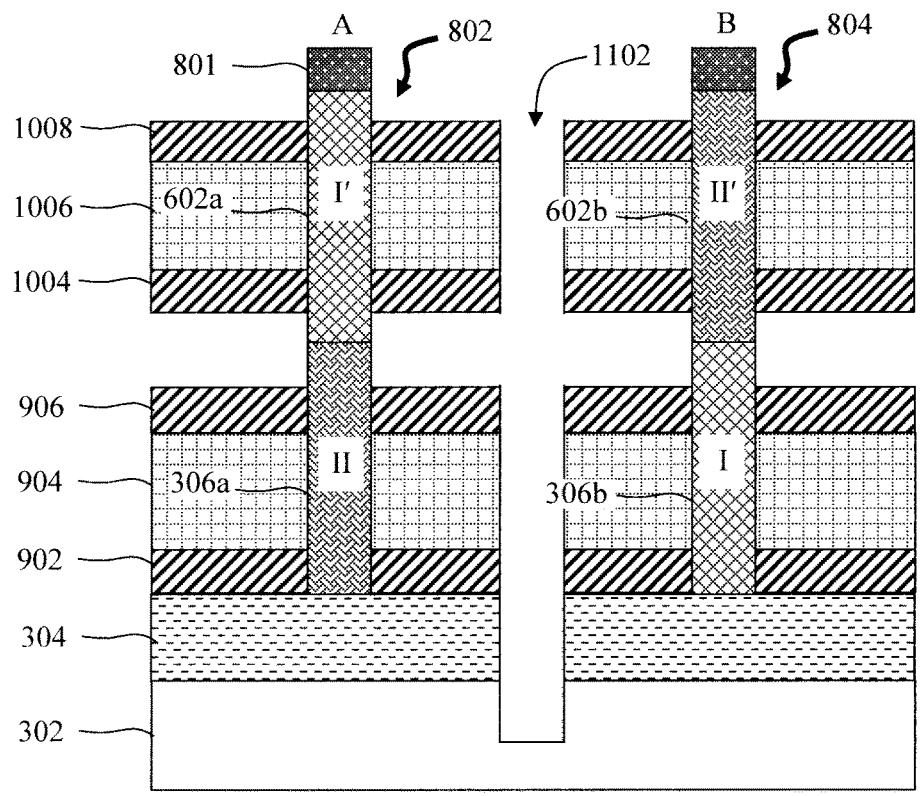
FIG. 12 is a cross-sectional diagram illustrating the sacrificial oxide layer having been removed according to an embodiment of the present invention.

Notably, the STI trench 1102 provides access to the sacrificial oxide layer 1002 separating the bottom and top fins. This permits the sacrificial oxide layer 1002 to be removed. See FIG. 12. According to an exemplary embodiment, the sacrificial oxide layer 1002 is removed using a non-directional (isotropic) etching process such as an oxide-selective wet etch. As shown in FIG. 12, removal of the sacrificial oxide layer 1002 exposes the sidewalls of the fins 802 and 804 in between the first/second middle spacers 906/1004. The sacrificial oxide layer 1002 is removed to expose the middle of the fins 802 and 804 to enable the (common) source to be formed (along with the top drain in the next step—see below).

Figure 13:
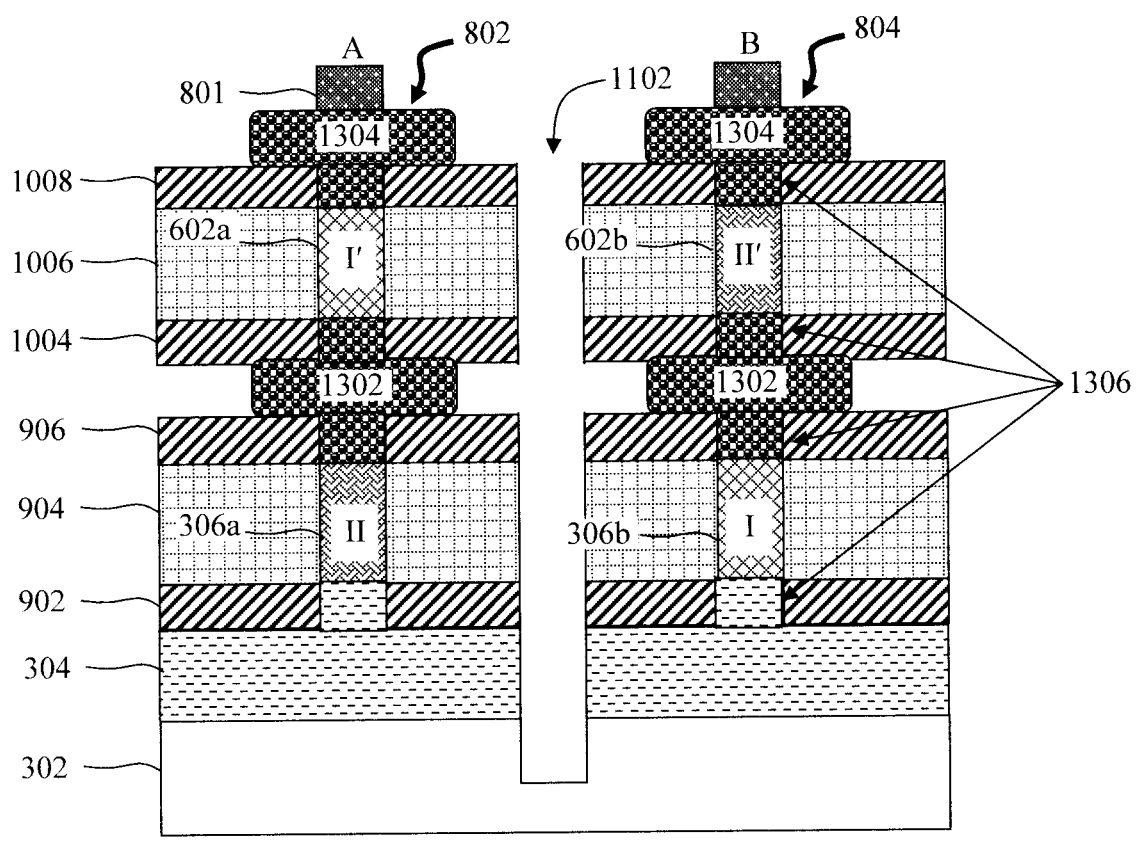
FIG. 13 is a cross-sectional diagram illustrating a source having been formed in between the bottom and top dummy gates, and a top drain having been formed above the top dummy gates in each of the fins according to an embodiment of the present invention.

Namely, as shown in FIG. 13, a source 1302 is formed in between the bottom and top dummy gates 904 and 1006, and a top drain 1304 is formed above the top dummy gates 1006 in each of the fins 802 and 804. According to an exemplary embodiment, an epitaxial process is used to grow the source 1302 and top drain 1304. For instance, the source 1302 and top drain 1304 are formed from a doped epitaxial material. As provided above, suitable n-type dopants include, but are not limited to, P and/or As, and suitable p-type dopants include, but are not limited to, B. By way of example only, the source 1302 and top drain 1304 can be formed from epitaxial phosphorous-doped Si (Si:P) or boron-doped SiGe (SiGe:B). Following formation of the source 1302 and top drain 1304, the fin hardmasks 801 can be removed.

Following epitaxial growth of the source 1302 and top drain 1304 an anneal is performed for dopant drive-in. According to an exemplary embodiment, this drive-in anneal is performed at a temperature of from about 800 to about 1270 and ranges therebetween, for a duration of from about 5 nano-seconds to about 1 minute and ranges therebetween (which depends on method (laser—nanosec or millisec), flash anneal, spike anneal, RTA). As shown in FIG. 13, this anneal drives dopants from the bottom drain 304, the source 1302 and top drain 1304 into respective portions of the fins 802 and 804, forming source/drain extensions (junctions) 1306 adjacent to the bottom drain 304, the source 1302 and top drain 1304.

Advantageously, the use of dummy gates at this stage in the process prevents elevated temperatures employed during the drive-in anneal from causing any performance degradation. For instance, subjecting high-κ gate dielectrics to high thermal stress can cause these materials to breakdown, thereby degrading device performance.

However, after the source and drains have been formed, the bottom/top dummy gates 904 and 1006 can be removed and replaced with the final, i.e., replacement, gates of the ROM device. To do so, the bottom/top dummy gates 904 and 1006 are first buried in an interlayer dielectric (ILD) 1402. Suitable ILD materials include, but are not limited to, $SiO_2$. The ILD 1402, as deposited, is then polished using a process such as chemical-mechanical polishing (CMP) to expose the bottom/top dummy gates 904 and 1006. The bottom/top dummy gates 904 and 1006 are then removed selective to the ILD 1402 and replaced with bottom/top replacement gates 1404 and 1406. See FIG. 14.

Figure 14:
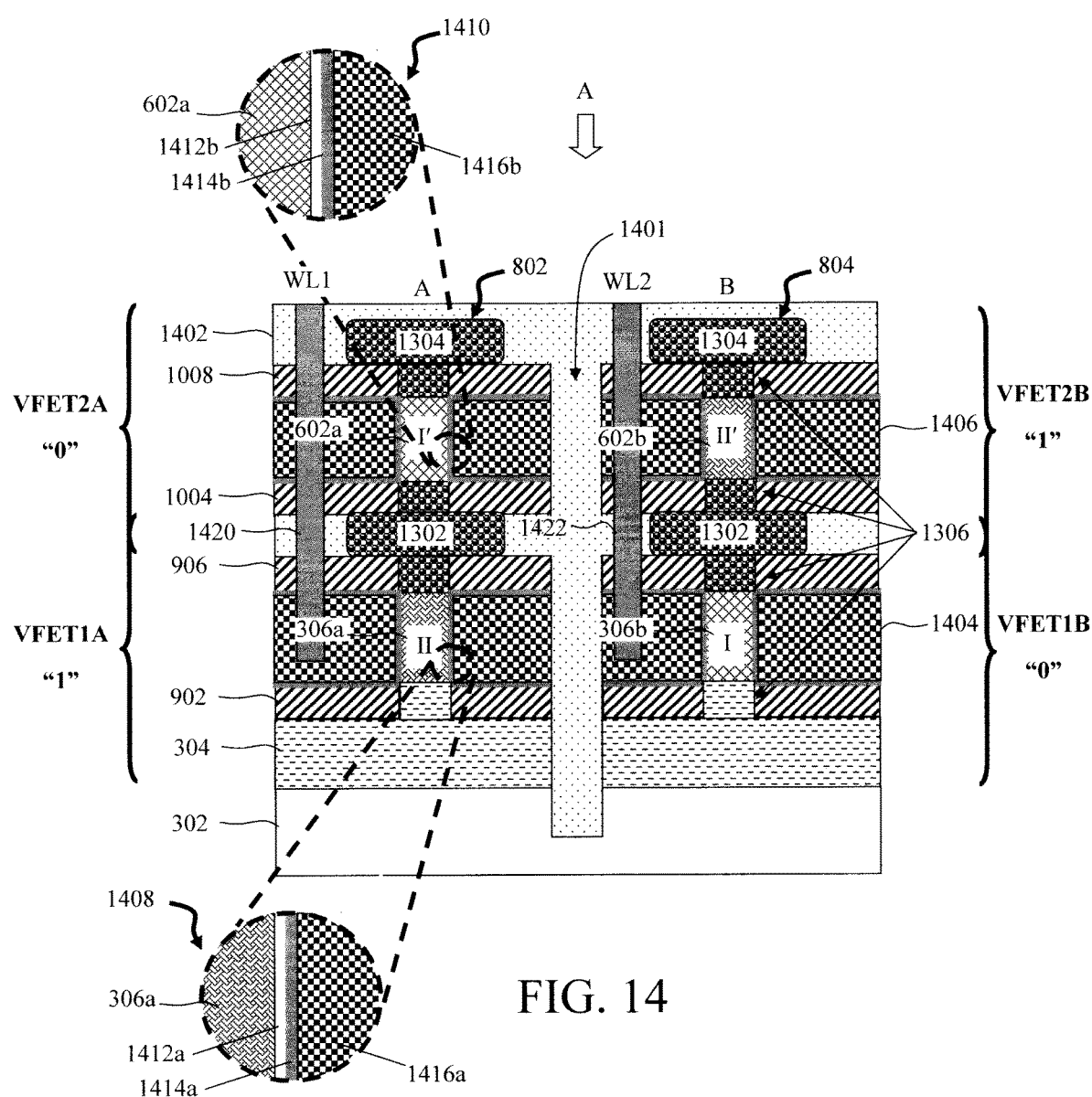
FIG. 14 is a cross-sectional diagram illustrating the bottom/top dummy gates having been buried in an ILD, the bottom/top dummy gates having been removed selective to the ILD and replaced with bottom/top replacement gates, and word line contacts having been formed to the bottom/top replacement gates alongside fins according to an embodiment of the present invention.

As shown in FIG. 14, the deposited ILD 1402 fills the STI trench 1102, acting as an insulator (e.g., an STI oxide 1401). However, access to the bottom/top dummy gates 904 and 1006 adjacent to the STI oxide 1401 can be made via the outer edges of the bottom/top dummy gates 904 and 1006 exposed by the CMP. Namely, while shown in cross-section, the bottom/top dummy gates 904 and 1006 surround the fins 802 and 804 in a gate-all-around (GAA) configuration. Thus, a non-directional (isotropic) etching process such as poly-Si or a-Si (depending on the particular dummy gate material employed—see above) can be used to clear the bottom/top dummy gates 904 and 1006 on both sides of the fins 802 and 804.

As shown in magnified views 1408 and 1410, the bottom/top replacement gates 1404 and 1406 each includes an interfacial oxide 1412a and 1412b on exposed surfaces of the patterned portions 306a,b/602a,b of the bottom fin and top fin, respectively, a gate dielectric 1414a and 1414b disposed over the interfacial oxide 1412a and 1412b, and a gate conductor 1416a and 1416b disposed on the gate dielectric. Interfacial oxide 1412a and 1412b can be formed by an oxidation process. According to an exemplary embodiment, interfacial oxide 1412a and 1412b is formed having a thickness of from about 0.3 nanometers (nm) to about 5 nm and ranges therebetween, e.g., about 1 nm.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as hafnium oxide ($HfO_2$), hafnium silicon oxide (HfSiOx), hafnium silicon oxynitride (HfSiOx), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiOx), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, gate dielectric 1414a and 1414b each have a thickness of from about 1 nm to about 5 nm and ranges therebetween, although less thicknesses and greater thicknesses are also conceived.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (Nisi)), transition metal aluminides (e.g. $Ti_3Al$, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. According to an exemplary embodiment, gate conductor 1416a and 1416b each have a thickness of from about 5 nm to about 20 nm and ranges therebetween, although less thicknesses and greater thicknesses are also conceived.

As shown in FIG. 14, the result is a ROM device having stacked VFETs (bottom) VFET1A and (top) VFET1B adjacent to stacked VFETs (bottom VFET1B) and (top) VFET2B. Further, based on the above-described process involving channel doping at different concentrations, VFET1A has "1" channel doping, while VFET2A has "0" channel doping. The adjacent VFETs have the opposite configuration. Namely, VFET1B has "0" channel doping while VFET2B has "1" channel doping.

Contacts to the bottom/top replacement gates 1404 and 1406, bottom drain 304, top drain 1304, and common source 1302 are then formed. For instance, as shown in FIG. 14, a word line contact 1420 (WL1) is formed to the bottom/top replacement gates 1404 and 1406 alongside fin 802 and a word line contact 1422 (WL2) is formed to the bottom/top replacement gates 1404 and 1406 alongside fin 804. By way of example only, word line contacts 1420 and 1422 can be formed using standard lithography and etching techniques to pattern contact trenches extending down through the ILD 1402, the top spacer 1008, the top replacement gates 1406, the second middle spacers 1004, the first middle spacers 906, and into the bottom replacement gates 1404. The contact trenches are then filled with a contact metal to form the word line contacts 1420 and 1422. Suitable contact metals include, but are not limited to, copper (Cu), tungsten (W), nickel (Ni) and/or platinum (Pt).

As shown in FIG. 14, WL contacts 1420 and 1422 interconnect the bottom/top replacement gates 1404 and 1406 alongside each fin 802 and 804. As provided above, additional area can be saved by connecting the word lines of the stacked VFETs together internally in this manner. Based on the different programmed values for the stacked VFETs, applying the same voltage bias to the bottom/top replacement gates 1404 and 1406 will turn one of the VFETs to the 'ON' state and the other to the 'OFF' state. To use a simple example, applying a voltage bias to WL contact 1420 (WL1) to turn on VFET1A will also turn off VFET2A, and vice versa. Similarly, applying a voltage bias to WL contact 1422 (WL2) to turn on VFET1B will also turn off VFET2B. In the present example, based on the programmed values, VFET1A in the 'ON' state (and VFET2A in the 'OFF' state) stores a logic "1" and VFET2A in the 'ON' state (and VFET1A in the 'OFF' state) stores a logic "0." Conversely, VFET1B in the 'ON' state (and VFET2B in the 'OFF' state) stores a logic "0" and VFET2B in the 'ON' state (and VFET2A in the 'OFF' state) stores a logic "1." By way of example only, as provided above, the channel doping concentration determines whether the threshold voltage (Vt) of the corresponding VFET is positive or negative, i.e., Vt<0 or Vt>0, and therefore whether the programmed value is "0" or "1," respectively. Therefore, a negative voltage bias can be used to write data to the VFETs with "0" channel doping, while a positive voltage bias can be used to write data to the VFETs with "1" channel doping.

Figure 15:
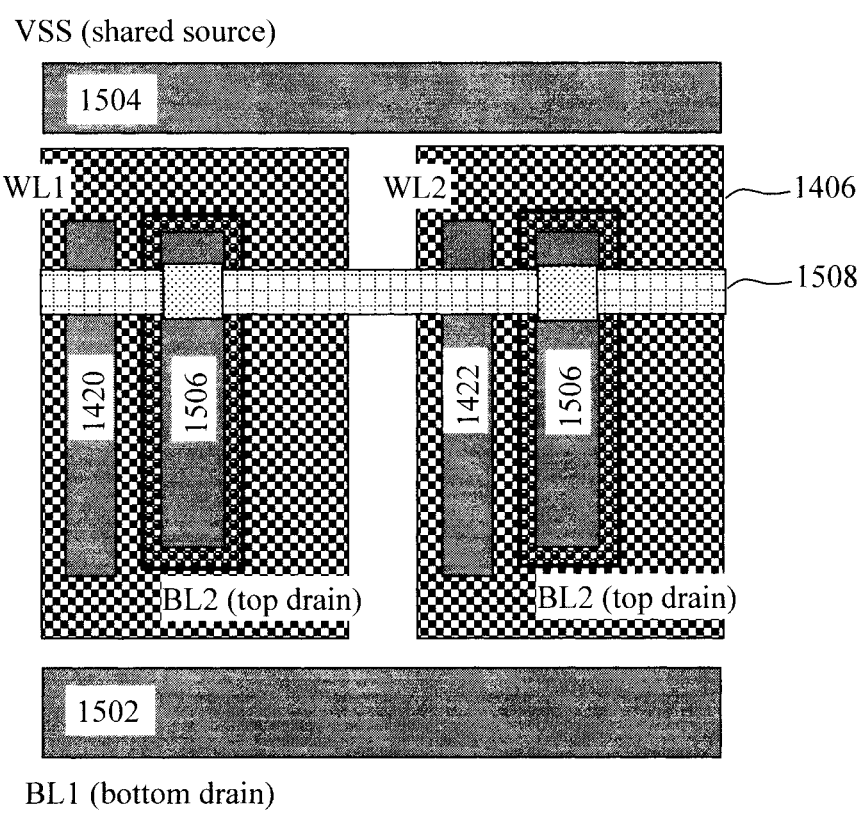
FIG. 15 is a top-down diagram illustrating bit line wiring orthogonal to the word line contacts according to an embodiment of the present invention.

FIG. 15 provides a top-down view of the device (e.g., from viewpoint A—see FIG. 14). For ease and clarity of depiction, top spacers 1008 and ILD 1402 is not shown in FIG. 15 so that an unobstructed top-down view of the top replacement gates 1406 and corresponding WL contacts 1420 and 1422. As provided above, the WL contacts 1420 and 1422 interconnect the bottom/top replacement gates 1404 and 1406 alongside each fin 802 and 804.

As shown in FIG. 15, bit line wiring 1502 (BL1) and VSS wiring 1504 run orthogonal to the word line contacts 1420 (WL1) and 1422 (WL2). According to an exemplary embodiment, the bit line wiring 1502 (BL1) is connected to the bottom drain 304, and the VSS wiring 1504 is connected to the shared source 1302. Bit line wiring 1506 (BL2), which is connected to the top drain 1304, are interconnected by metal line 1508.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A read-only memory (ROM) device, comprising:
a wafer;
a bottom drain disposed on the wafer;
fins disposed on the bottom drain, wherein the fins comprise a top portion having a channel dopant at a different concentration than a bottom portion of the fins;
bottom gates disposed alongside the bottom portion of the fins and top gates disposed alongside the top portion of the fins;
a source in between the bottom gates and the top gates; and
a top drain disposed above the top gates, wherein the bottom drain, the bottom gates, the bottom portion of the fins, and the source comprise bottom VFETs of the ROM device, and wherein the source, the top gates, the top portion of the fins, and the top drain comprise top VFETs of the ROM device stacked on the bottom VFETs.

2. The ROM device of claim 1, wherein the fins comprise at least a first fin and a second fin.

3. The ROM device of claim 2, wherein the top portion of the first fin and the bottom portion of the second fin comprise the channel dopant at a first concentration, and wherein the bottom portion of the first fin and the top portion of the second fin comprise the channel dopant at a second concentration.

4. The ROM device of claim 3, wherein the channel dopant is selected from the group consisting of: phosphorous, arsenic, boron, and combinations thereof.

5. The ROM device of claim 3, wherein the first concentration is from about $1 \times 10^{18}$ cm$^{-3}$ to about $1 \times 10^{19}$ cm$^{-3}$ and ranges therebetween corresponding to a programmed value "0," and wherein the second concentration is from about $1 \times 10^{15}$ cm$^{-3}$ to about $1 \times 10^{16}$ cm$^{-3}$ and ranges therebetween corresponding to a programmed value "1".

6. The ROM device of claim 1, wherein the bottom gates and the top gates comprise:
an interfacial oxide on the fins;
a gate dielectric over the interfacial oxide; and
a gate conductor on the gate dielectric.

7. The ROM device of claim 6, wherein the interfacial oxide has a thickness of from about 0.3 nanometers (nm) to about 5 nm and ranges therebetween.

8. The ROM device of claim 6, wherein the gate dielectric comprises a material selected from the group consisting of: silicon oxide (SiOx), silicon nitride (SiN), silicon oxynitride (SiOxNy), hafnium oxide (HfO$_2$), hafnium silicon oxide (HfSiOx), hafnium silicon oxynitride (HfSiOx), lanthanum oxide (La$_2$O$_3$), lanthanum aluminum oxide (LaAlO$_3$), zirconium oxide (ZrO$_2$), zirconium silicon oxide (ZrSiO$_4$), zirconium silicon oxynitride (ZrSiOxNy), tantalum oxide (TaOx), titanium oxide (TiOx), barium strontium titanium oxide (BaO$_6$SrTi$_2$), barium titanium oxide (BaTiO$_3$), strontium titanium oxide (SrTiO$_3$), yttrium oxide (Y$_2$O$_3$), aluminum oxide (Al$_2$O$_3$), lead scandium tantalum oxide (Pb(Sc,Ta)O$_3$), lead zinc niobite (Pb(Zn,Nb)O), and combinations thereof.

9. The ROM device of claim 6, wherein the gate conductor comprises a material selected from the group consisting of: doped polycrystalline silicon (Si), amorphous Si, germanium (Ge), silicon germanium (SiGe), tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi), transition metal aluminides, carbon nanotubes, conductive carbon, graphene, and combinations thereof.

10. The ROM device of claim 1, further comprising:
a contact interconnecting the bottom gates and the top gates alongside a given one of the fins.

11. The ROM device of claim 10, wherein the contact comprises a metal selected from the group consisting of: copper (Cu), tungsten (W), nickel (Ni), platinum (Pt), and combinations thereof.

12. The ROM device of claim 1, further comprising:
bottom spacers disposed on the bottom drain;
first middle spacers disposed on the bottom gates below the source;
second middle spacers above the source; and
top spacers disposed on the top gates.

13. A ROM device, comprising:
a wafer;
a bottom drain disposed on the wafer;
fins disposed on the bottom drain, wherein the fins comprise a top portion having a channel dopant at a different concentration than a bottom portion of the fins, wherein the fins comprise at least a first fin and a second fin, and wherein a top portion of the first fin and a bottom portion of the second fin comprise the channel dopant at a first concentration, and wherein a bottom portion of the first fin and a top portion of the second fin comprise the channel dopant at a second concentration;
bottom gates disposed alongside the bottom portion of the fins and top gates disposed alongside the top portion of the fins;
a source in between the bottom gates and the top gates; and
a top drain disposed above the top gates,
wherein the bottom drain, the bottom gates, the bottom portion of the fins, and the source comprise bottom VFETs of the ROM device, and wherein the source, the top gates, the top portion of the fins, and the top drain comprise top VFETs of the ROM device stacked on the bottom VFETs.

14. The ROM device of claim 13, wherein the channel dopant is selected from the group consisting of: phosphorous, arsenic, boron, and combinations thereof.

15. The ROM device of claim 13, wherein the first concentration is from about $1 \times 10^{18}$ cm$^{-3}$ to about $1 \times 10^{19}$ cm$^{-3}$ and ranges therebetween corresponding to a programmed value "0," and wherein the second concentration is from about $1 \times 10^{15}$ cm$^{-3}$ to about $1 \times 10^{16}$ cm$^{-3}$ and ranges therebetween corresponding to a programmed value "1".

16. The ROM device of claim 13, wherein the bottom gates and the top gates comprise:
an interfacial oxide on the fins;
a gate dielectric over the interfacial oxide; and
a gate conductor on the gate dielectric.

17. The ROM device of claim 16, wherein the gate dielectric comprises a material selected from the group consisting of: SiOx, SiN, SiOxNy, HfO$_2$, HfSiOx, HfSiOx, La$_2$O$_3$, LaAlO$_3$, ZrO$_2$, ZrSiO$_4$, ZrSiOxNy, TaOx, TiOx, BaO$_6$SrTi$_2$, BaTiO$_3$, SrTiO$_3$, Y$_2$O$_3$, Al$_2$O$_3$, Pb(Sc,Ta)O$_3$, Pb(Zn,Nb)O, and combinations thereof.

18. The ROM device of claim 16, wherein the gate conductor comprises a material selected from the group consisting of: doped polycrystalline Si, amorphous Si, Ge, SiGe, W, Ti, Ta, Ru, Hf, Zr, Co, Ni, Cu, Al, Pt, Sn, Ag, Au, TaN, TiN, TaC, TiC, TiAlC, WSi, WN, RuO$_2$, CoSi, NiSi, transition metal aluminides, carbon nanotubes, conductive carbon, graphene, and combinations thereof.

19. The ROM device of claim 13, further comprising:
a contact interconnecting the bottom gates and the top gates alongside a given one of the fins.

20. The ROM device of claim 13, further comprising:
bottom spacers disposed on the bottom drain;
first middle spacers disposed on the bottom gates below the source;
second middle spacers above the source; and
top spacers disposed on the top gates.

\* \* \* \* \*